(12) United States Patent
Crippa et al.

(10) Patent No.: US 7,719,894 B2
(45) Date of Patent: May 18, 2010

(54) METHOD OF PROGRAMMING CELLS OF A NAND MEMORY DEVICE

(76) Inventors: Luca Crippa, Via Manzoni, 66, 20040 Busnago (IT); Roberto Ravasio, Via Don Seghezzi, 16, 24030 Presezzo (IT); Rino Micheloni, Via Como, 8, 22078 Turate (IT)

( * ) Notice: Subject to any disclaimer, the term of this patent is extended or adjusted under 35 U.S.C. 154(b) by 326 days.

(21) Appl. No.: 11/828,716

(22) Filed: Jul. 26, 2007

(65) Prior Publication Data

US 2008/0049511 A1 Feb. 28, 2008

(30) Foreign Application Priority Data

Jul. 28, 2006 (EP) .................................. 06425536

(51) Int. Cl.
*G11C 16/04* (2006.01)
(52) U.S. Cl. ........................... 365/185.18; 365/185.17; 365/185.13; 365/185.02
(58) Field of Classification Search ............ 365/185.17, 365/185.18, 185.13, 185.02
See application file for complete search history.

(56) References Cited

U.S. PATENT DOCUMENTS

| 6,005,802 | A | 12/1999 | Takeuchi et al. | ........ 365/185.02 |
| 7,298,647 | B2 * | 11/2007 | Li et al. | .................. 365/185.02 |
| 7,453,729 | B2 * | 11/2008 | Lee | ......................... 365/185.18 |
| 2005/0057965 | A1 | 3/2005 | Cernea et al. | ............... 365/177 |

* cited by examiner

*Primary Examiner*—Hoai V Ho
*Assistant Examiner*—Fernando N Hidalgo
(74) *Attorney, Agent, or Firm*—Schwabe, Williamson & Wyatt, P.C.

(57) ABSTRACT

The capacitive coupling between two adjacent bitlines of a NAND memory device may be exploited for boosting the voltage of bitlines that are not to be programmed in order to inhibit program operations on them. The even (odd) bitlines that include cells not to be programmed are biased with a first voltage for inhibiting them from being programmed while the even (odd) bitlines that include cells to be programmed are grounded. The adjacent odd (even) bitlines are biased at the supply voltage or at an auxiliary voltage for boosting the bias voltage of the even (odd) bitlines above the supply voltage. The bias voltage of the even (odd) bitlines that include cells not to be programmed is boosted because of the relevant parasitic coupling capacitances between adjacent bitlines.

17 Claims, 12 Drawing Sheets

METHOD OF PROGRAMMING CELLS OF A NAND MEMORY DEVICE

FIELD OF THE INVENTION

The present invention relates in general to memory devices, and in particular, to a method of programming memory cells of a NAND memory device.

BACKGROUND OF THE INVENTION

A logic state is stored in a cell by programming its threshold voltage. In nonvolatile memory devices, this is done by transferring a certain electrical charge in a floating gate of the cell.

The storage capacity of memory devices can be multiplied by storing more than one bit of information in each single cell of the same physical structure as if it is intended to store a single information bit. This is in addition to increasing the integration density of arrays of cells individually addressable through wordlines and bitlines of the array.

Though based on the same physical mechanisms, the programming and reading of cells that store more than one bit (multi-level cells) are carried out with techniques that differ from those used for cells that store a single bit (two-level cells).

To read a two-level memory array cell, a certain voltage is applied to the control gate (wordline) of the cell. The value of a reading voltage is between the threshold voltage of an erased cell and the threshold voltage of a programmed cell such that when the cell is programmed, the reading voltage is lower than its threshold voltage. As a consequence, no current flows through the cell. In contrast, when the cell is erased, the reading voltage is higher than its threshold voltage, and thus a current flows through the cell.

In four-level cells, two bits of information may be stored by making the programming voltages of the different thresholds that may be set for one memory cell define four different intervals. Each interval is associated to a respective two-bit datum. A reading operation is carried out by comparing an electrical parameter, correlated with the current that flows through the cell, with four distinct reference intervals. The intervals are defined by the three different thresholds that may be programmed for each single cell. Each cell is associated with a respective two-bit datum, and thus determining the logic datum associated to the distinct interval of values (threshold voltage distributions) in which the measured electrical parameter falls. This approach for a multi-level operation of the cells is applicable to volatile memory cells, such as DRAMs, as well as to nonvolatile memory devices, such as EEPROMs and FLASH-EPROMs.

Figure 1:
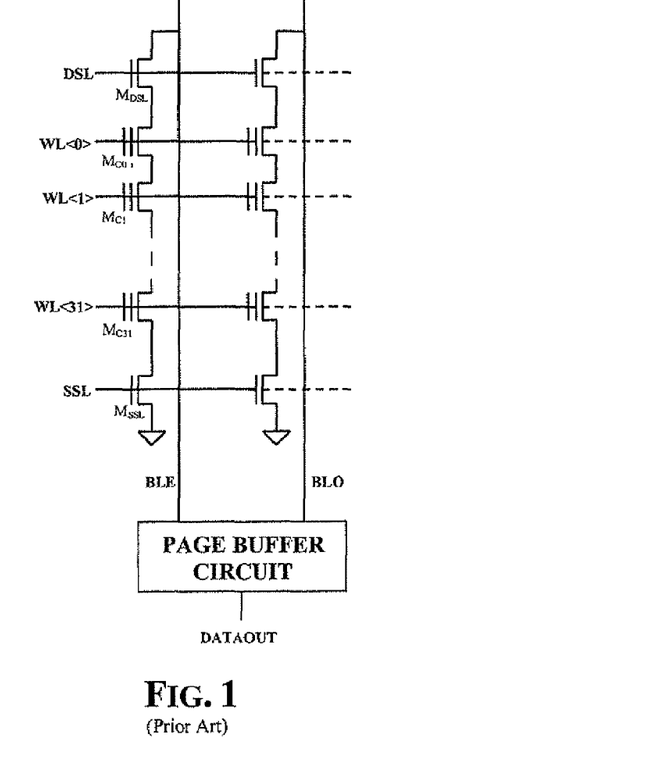
FIG. 1 depicts two bitlines of a NAND memory device and a page buffer connected to them according to the prior art.

A basic circuit scheme of two memory array bitlines and a page buffer of a four-level memory of the FLASH type is depicted in FIG. 1. The page buffer manages the operations of reading the information stored in the memory cells of a selected memory page, or writing new information in the cells. The selection transistors $M_{DSL}$ and $M_{SSL}$ connect to the bitline or to ground, respectively, the series of memory cells.

The basic operations that usually are performed on the memory cells are a page read (an operation involving reading data from a selected memory page), a page program (writing data into a selected memory page), and an erase operation (the content of the memory cells is erased).

In four-level memory devices, a two-bits datum may be stored in each cell by programming the latter in any one of four different states. Each one is associated with a corresponding logic value of the two-bits datum. Usually, the programming state of a memory cell is defined by the threshold voltage value of the transistor structure that is included in the memory cell structure.

Figure 2:
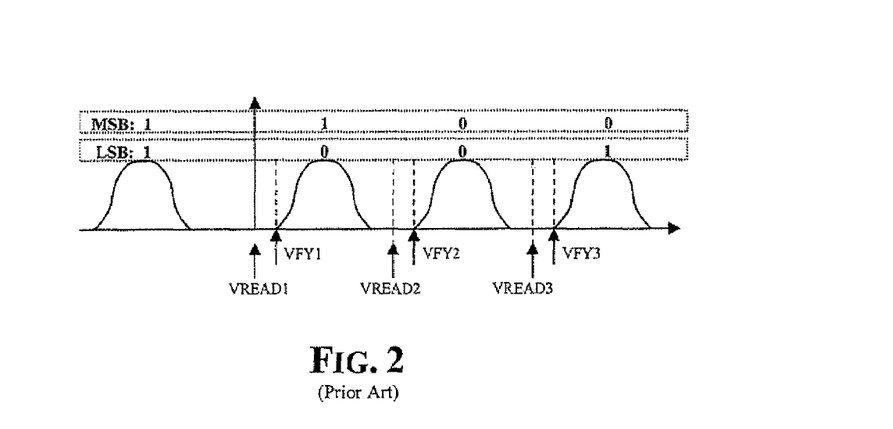
FIG. 2 illustrates the Gray coding for a four-level memory cell according to the prior art.

In a memory cell adapted to store two bits, the threshold voltage values of the memory cells may assume one of four different values or ranges of values. A typical choice is to associate the logic values of the stored bit pair to the four different states according to a binary sequence 11, 10, 01, and 00, as shown in FIG. 2, corresponding to increasing threshold voltage values, with the logic value 11 that is associated with the state of the lowest threshold voltage value (erased state). The others are associated in succession to states of increased threshold voltage values.

The cells of a memory page (wordline), both if they are intended to store one bit or two bits of information, are programmed in parallel by incrementing stepwise their threshold voltage. Typically, the PAGE BUFFER biases the bitline at the ground potential for programming the cells, or to a supply potential VDD for not programming the cells. The control voltage DSL of the selection transistor $M_{DSL}$ of the series (stack) to which the wordline to be programmed belongs is at the supply voltage VDD. This is while the control signal SSL (source selector) is at the ground potential while the source line (not depicted) is at the voltage VDD.

Figure 3:
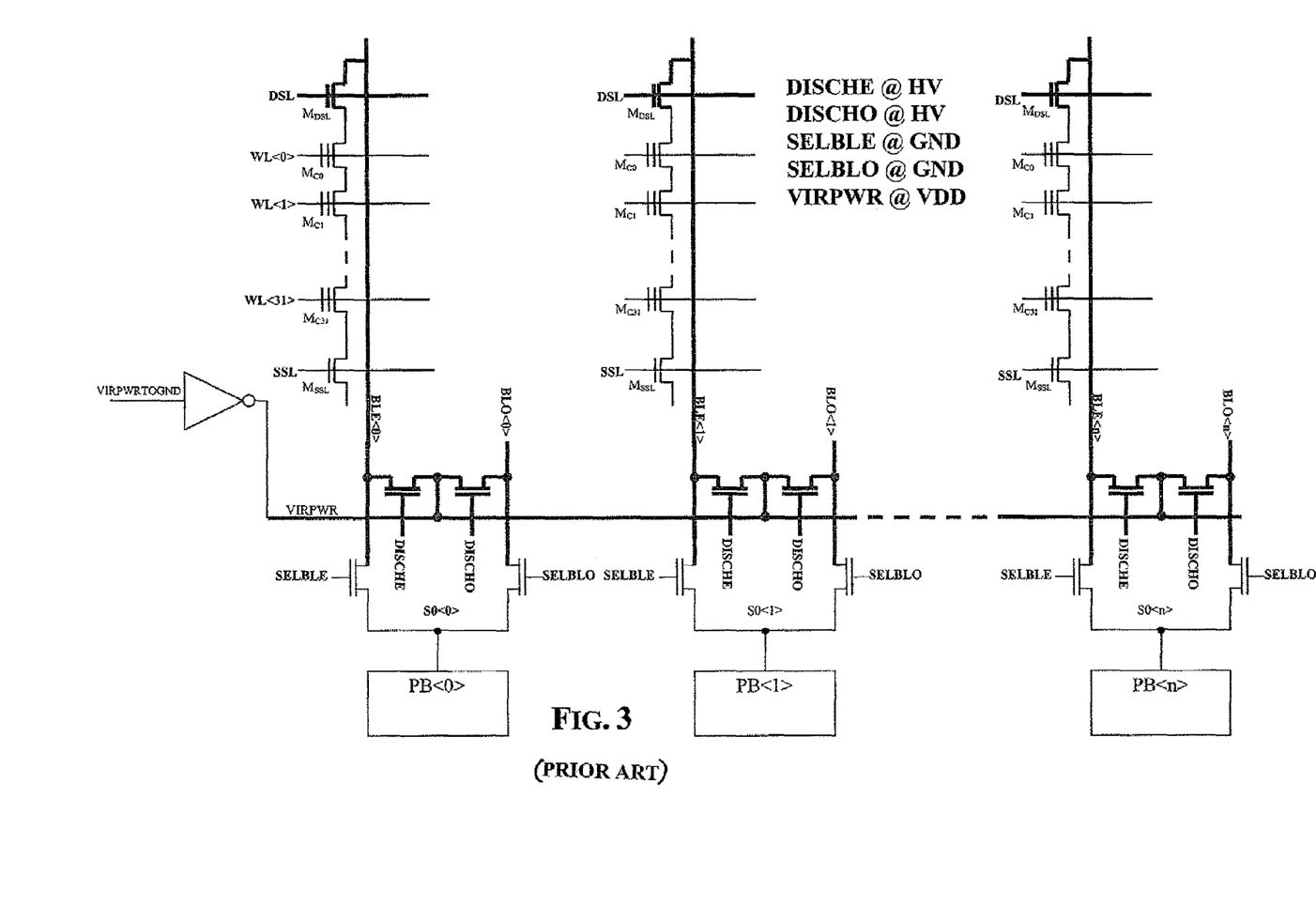
FIG. 3 depicts schematically a NAND memory device with highlighted electrical paths that are active while precharging the bitline according to the prior art.
Figure 4:
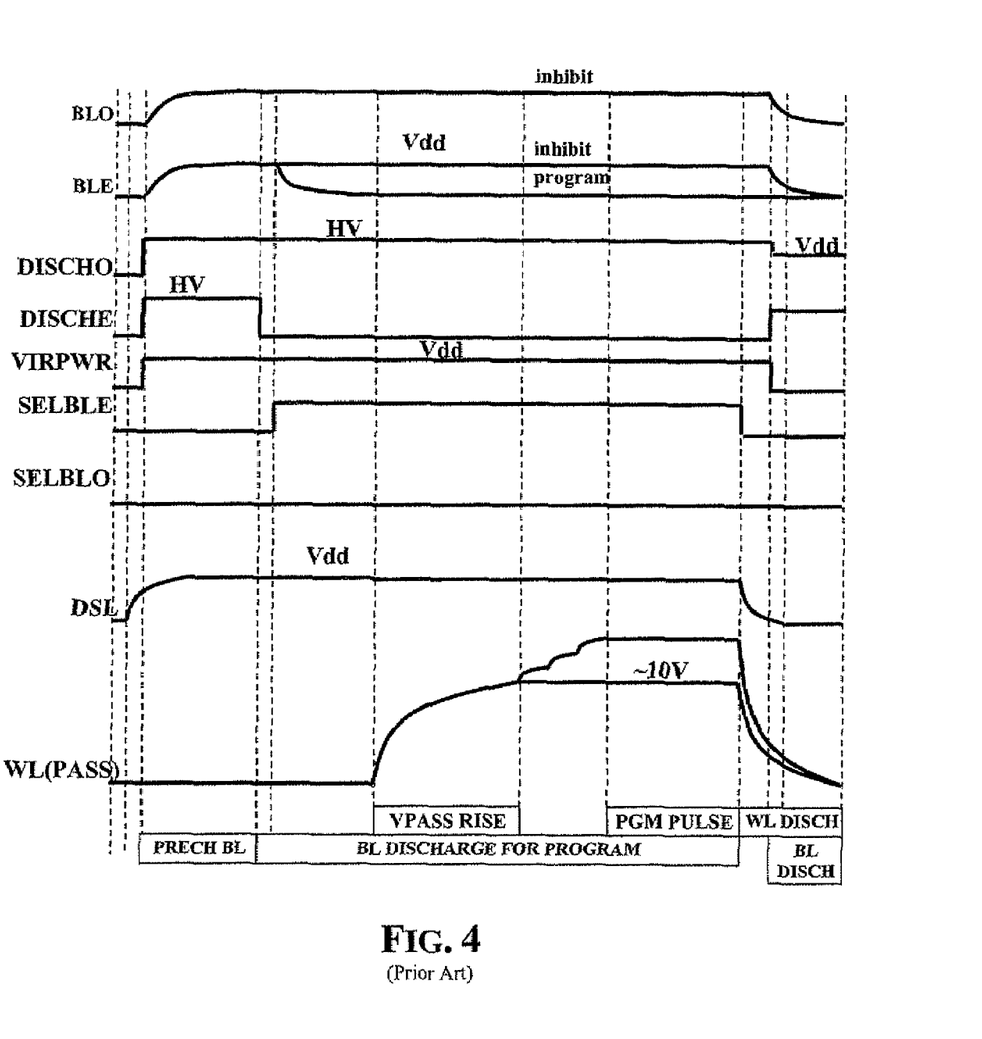
FIG. 4 shows timing diagrams of the main signals of the device of FIG. 3 during a program operation.

A typical timing diagram of the main signals during the execution of the sequence of steps for programming a bitline BLE is depicted in FIG. 4. All the bitlines are charged (FIG. 3), and the gate of the selection transistors DSL are brought at the supply potential VDD. The channels are biased at the voltage VDD-VTH, where VTH is the threshold of the selection transistors $M_{DSL}$.

Figure 5:
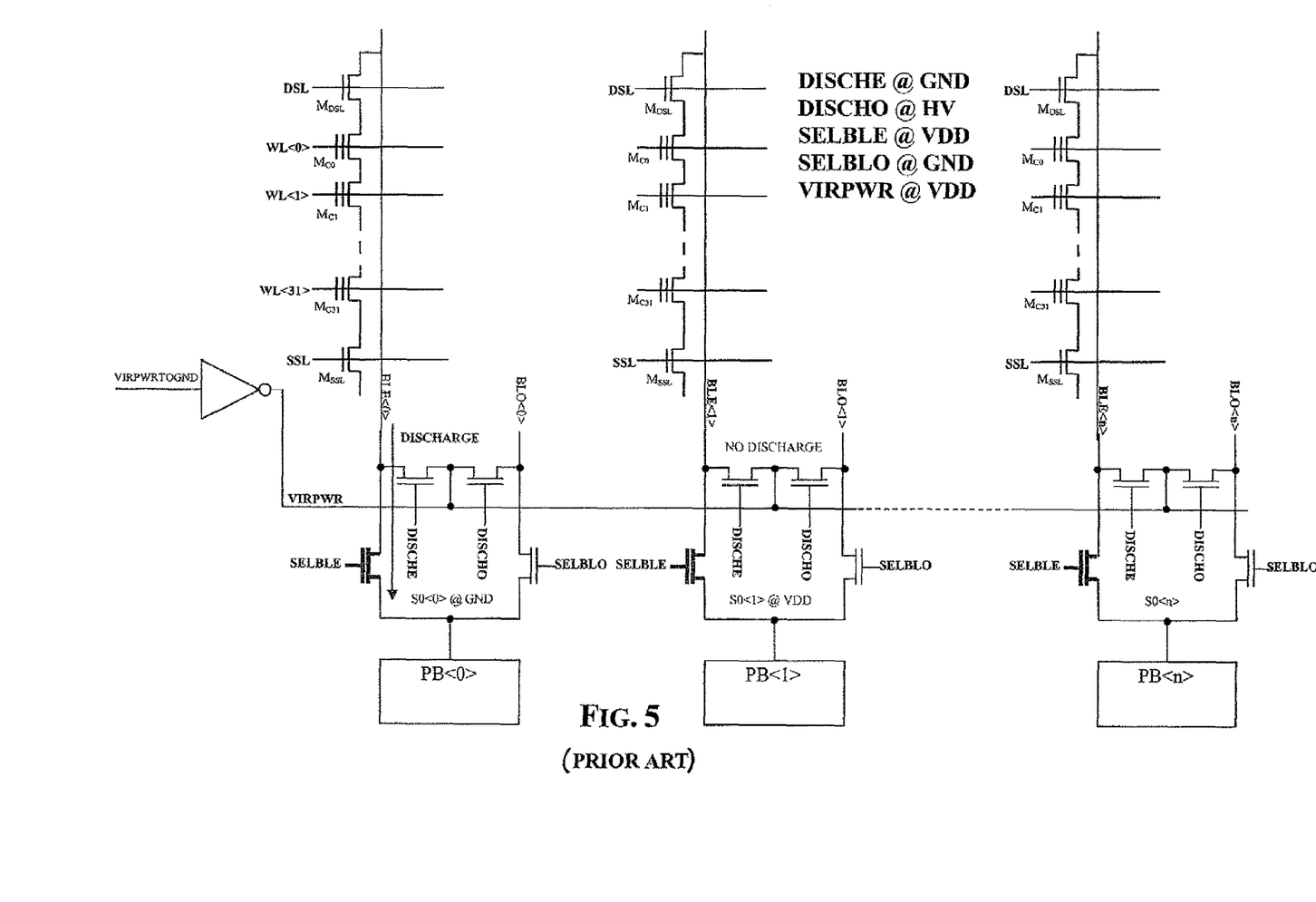
FIG. 5 is similar to FIG. 3 and illustrates the bitline selective discharge step.

Then the control signal SELBLE is asserted while the signals DISCHE, DISCHO are switched to turn off the respective transistors, and the page buffer discharges only the bitlines that contain cells that should be programmed. This is while leaving at the supply voltage VDD all the cells that should not be programmed, as shown in FIG. 5. After this phase, all the wordlines are biased at an intermediate voltage, typically about 8 to 10V. Then the wordlines to be programmed are biased from this intermediate voltage to the programming voltage.

This step may take place in two ways. One way is for the gate of the cell to be programmed to be directly brought to the programming voltage. But in this case, the resistance and the capacitance of the row determines the charge time. Alternatively, the programming voltage is attained in a controlled fashion by imposing a voltage ramp with a desired slope, for example a slope of 1 V/µs.

Because of the very small pitch of the cells, the coupling capacitances between the wordline and the line DSL (but also among the wordlines themselves) is relatively large. If the gate of the selected cell is biased directly at the programming voltage, the voltage on the line DSL could increase, especially when the cell adjacent to the transistor $M_{DSL}$ is to be programmed above the voltage VDD.

Since the unselected bitlines are biased at the voltage VDD, increasing the gate voltage of the transistor $M_{DSL}$ could reduce the bias voltage of the relative channel. Because of the capacitive coupling between the wordline and the line DSL, the gate voltage of the transistor $M_{DSL}$ could surpass the supply voltage VDD by at least a threshold voltage and the selection switch $M_{DSL}$ could be turned on. This would connect the channel, at a boosted voltage, to the respective bitline that is at the supply voltage. As a consequence, the cells that are on the same wordline of a cell to be programmed could be programmed even if they should not be programmed.

To address this problem, the bitline is biased at a voltage larger than VDD. The drawbacks of this approach is that there is an increment of silicon area consumption because of the need of integrating additional charge pump generators capable of supplying a current and a voltage sufficient for inhibiting the cells not to be programmed. Also, the time required for biasing all the bitlines is increased.

SUMMARY OF THE INVENTION

In view of the foregoing background, an object of the invention is to program cells of a NAND memory device while overcoming the above drawbacks. This is based on the fact that the capacitive coupling between two adjacent bitlines is relevant, and this may be exploited for boosting the voltage of the bitlines that are not to be programmed in order to inhibit program operations on them.

This and other objects, advantages and features in accordance with the invention are provided by a method comprising biasing the even (odd) bitlines that include cells not to be programmed with a first voltage for inhibiting them from being programmed while the even (odd) bitlines that include cells to be programmed are grounded. The bias may typically be the supply voltage. Successively, the adjacent odd (even) bitlines may be biased at the supply voltage or at an auxiliary voltage for boosting the bias voltage of the even (odd) bitlines above the supply voltage.

The bias voltage of the even (odd) bitlines that include cells not to be programmed may be boosted because of the relevant parasitic coupling capacitances between adjacent bitlines. Therefore, no dedicated charge pump generator is needed. If a charge pump voltage generator is included in the memory device, it is possible to use its boosted output voltage for biasing the odd (even) bitlines after having biased at the supply voltage the even (odd) bitlines.

The above method is particularly suitable for programming cells of a FLASH NAND memory device.

BRIEF DESCRIPTION OF THE DRAWINGS

The invention will be described referring to the attached drawings, wherein.

DETAILED DESCRIPTION OF THE PREFERRED EMBODIMENT

Figure 6:
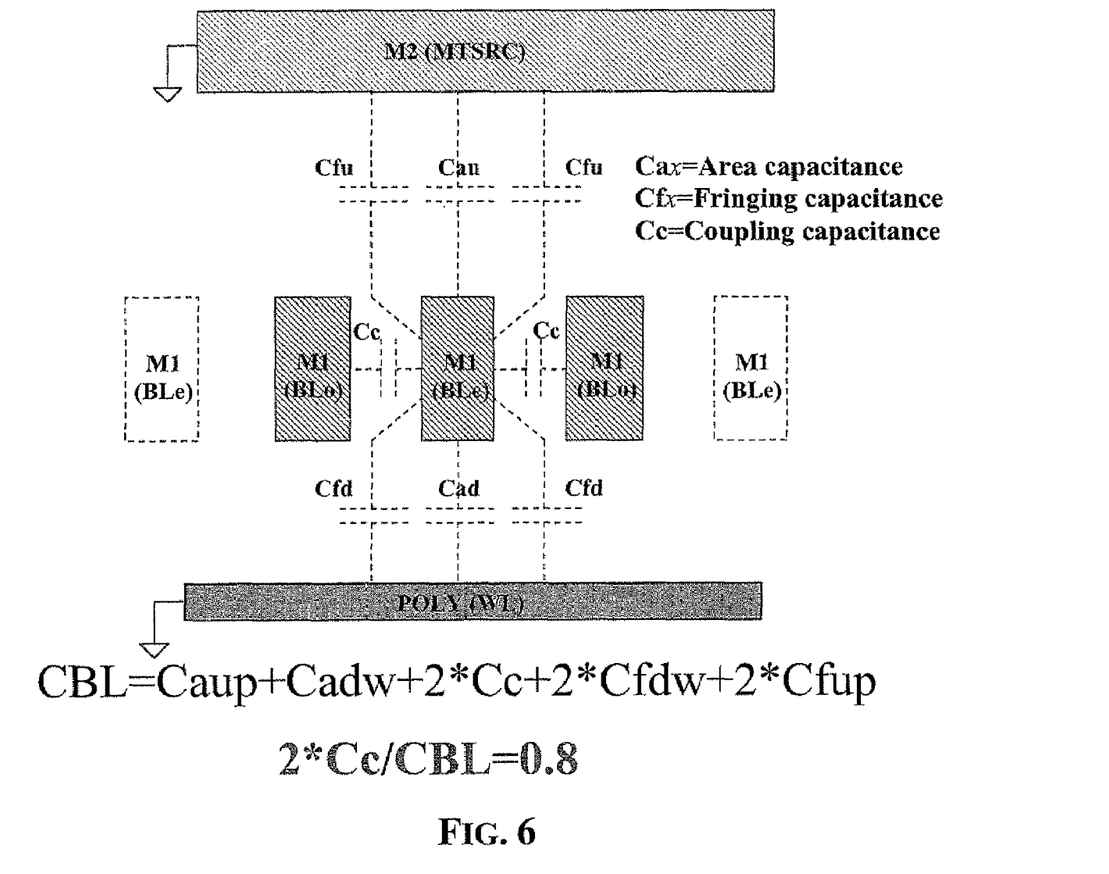
FIG. 6 shows the parasitic capacitances between the central bitline and the various parts of the memory device according to the present invention.

For ease of comparison with the prior art, the invention will be described for the case of a FLASH NAND memory device. There is a way of biasing the bitlines that are not to be programmed with a boosted voltage larger than the supply voltage VDD without using charge pump generators or increasing program times. This may be obtained by exploiting the coupling capacitances between adjacent bitlines. Coupling capacitances among a bitline and the two bitlines adjacent thereto are almost 80% of the total capacitance of the bitline (FIG. 6).

A main difference between the illustrated method of programming a memory cell of a NAND memory device is that not all the bitlines are programmed at the same time, but the cells of the even (odd) bitlines are programmed before the odd (even) bitlines. Of course, the roles of the even and the odd bitlines may be exchanged between them.

Figure 7:
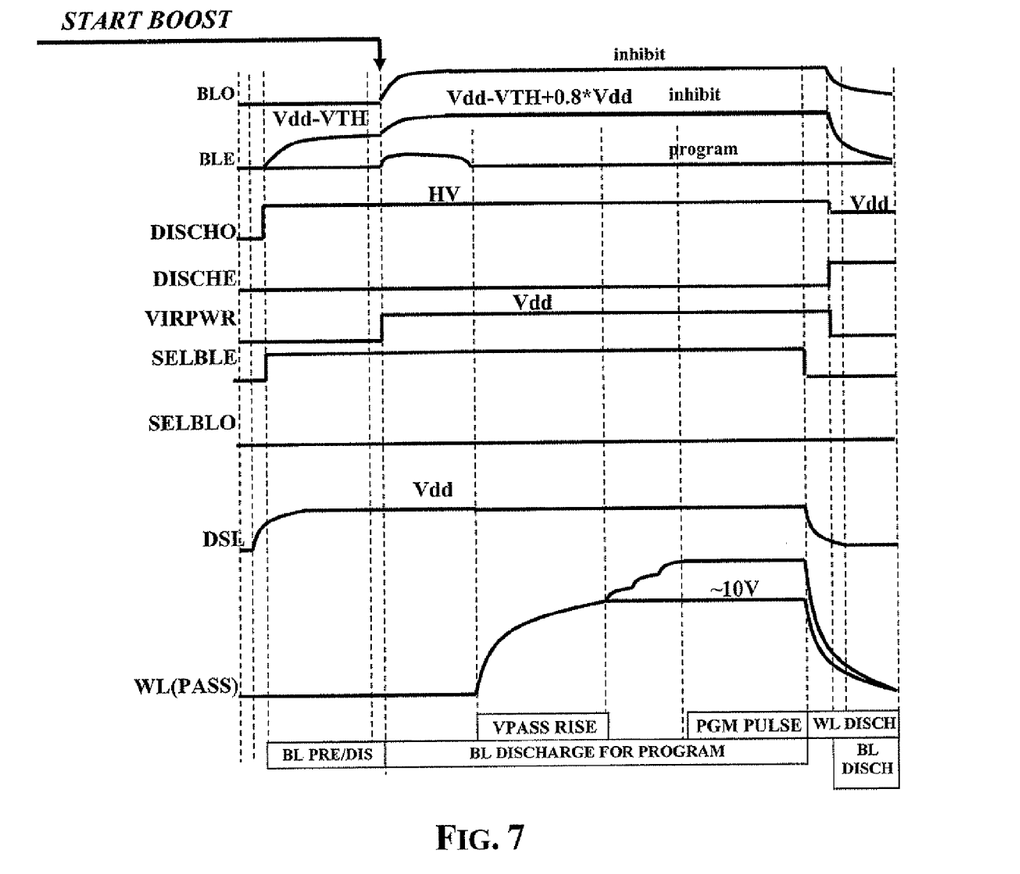
FIG. 7 is a timing graph of the main signals of the memory device during a program operation according to a first embodiment of the present invention.
Figure 8:
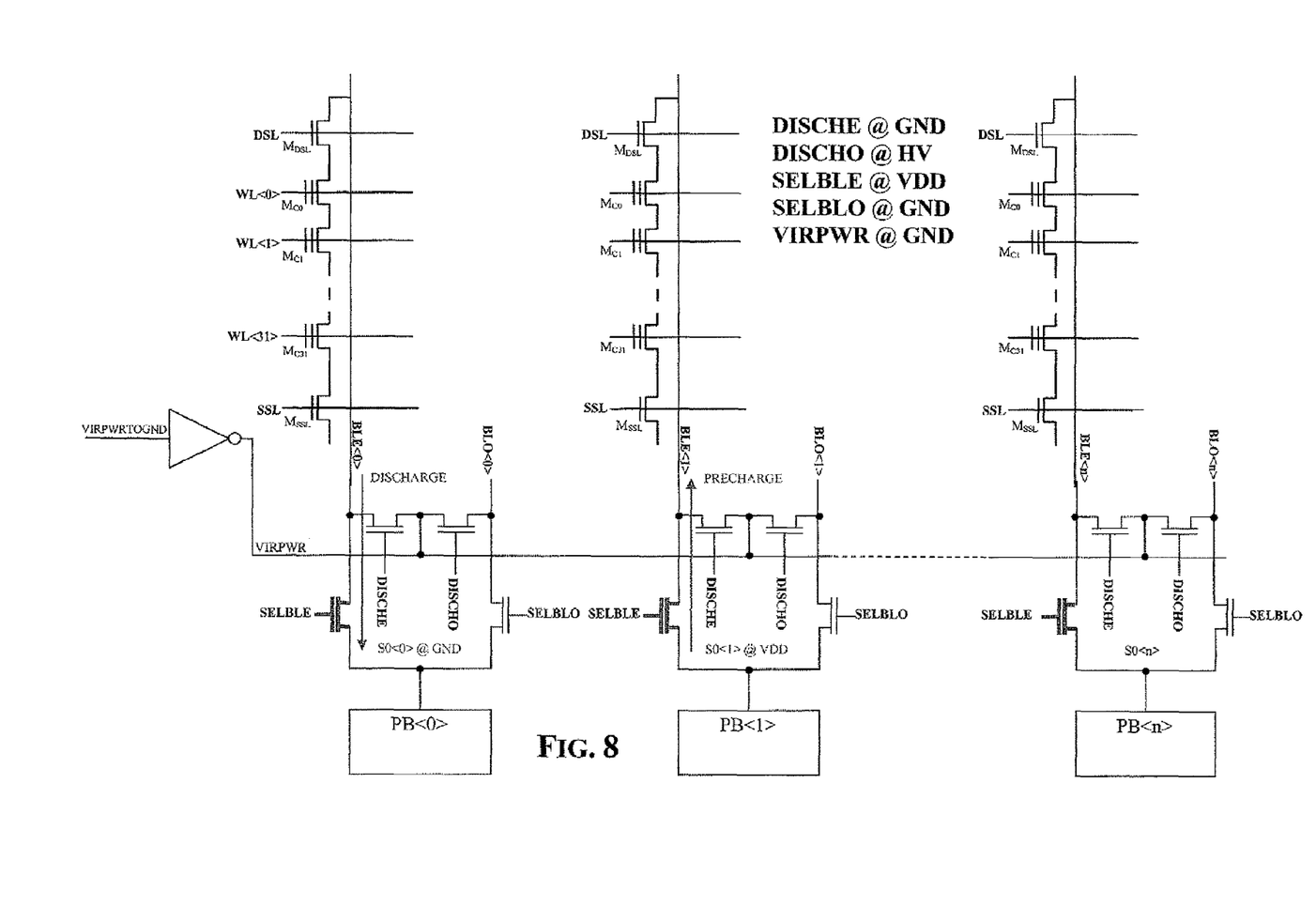
FIGS. 8 to 10 illustrate various steps of a first embodiment of the method according to the present invention.

A sample timing of the main signals of the memory device when programming according to a first embodiment of the method is depicted in FIG. 7. Referring to FIG. 8, suppose that the cells of the even bitlines are programmed first. In this situation, the odd bitlines and the even bitlines that include cells to be programmed are grounded (DISCHE and VIRPWR are grounded, while DISCHO is at a boosted voltage HV for discharging the odd bitlines), otherwise they are biased with a voltage VDD-VTH if they include cells not to be programmed.

This last operation is carried out by connecting the bitlines to be biased to the respective output node of the page buffer PB through the signals SELBLE.

Figure 9:
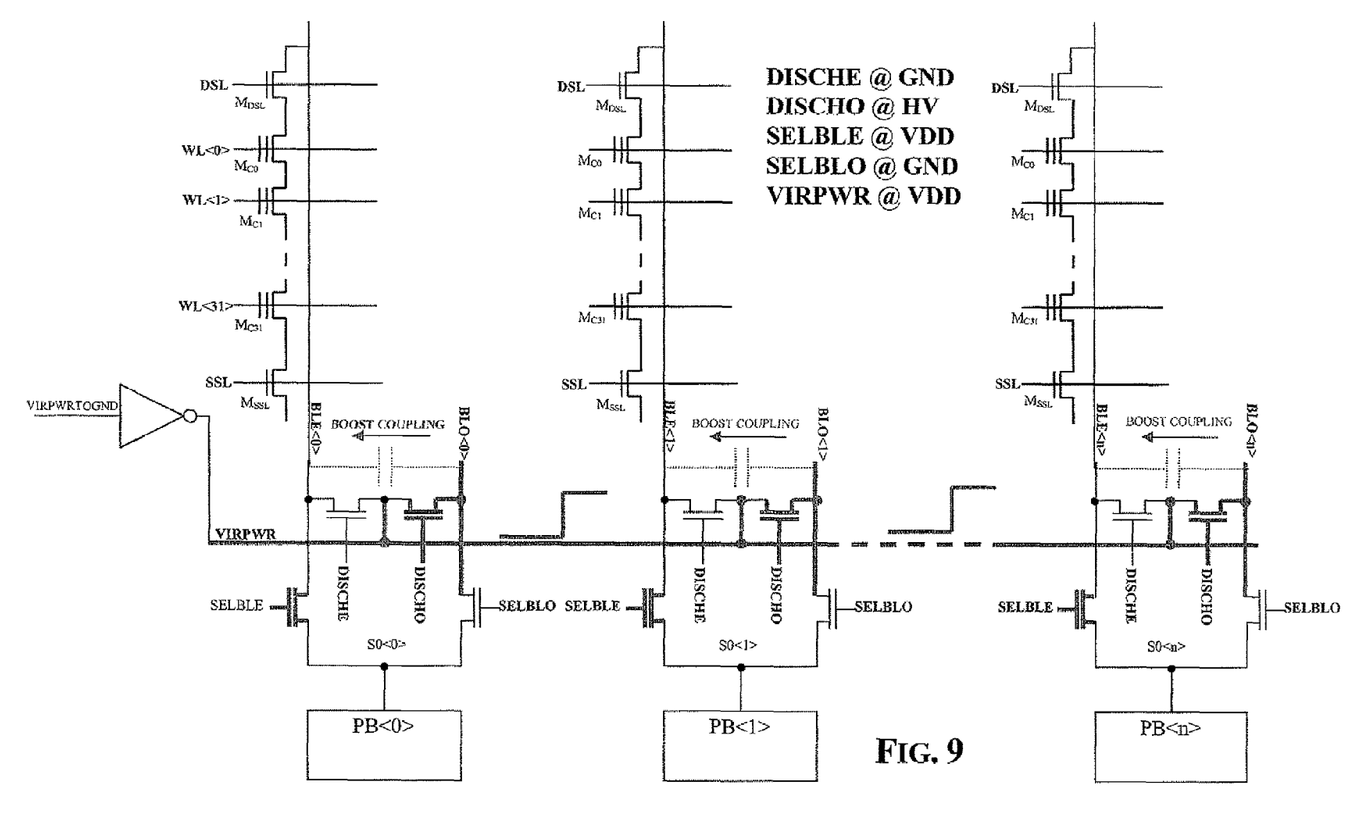

At the end of the transient for biasing the even bitlines at the voltage VDD-VTH, the node VIRPWR is brought to the supply voltage VDD. The odd bitlines are brought to the voltage VDD because the signal DISCHO is still high and at the same time the bias voltage of the even bitlines is boosted (FIG. 9) because of the coupling capacitances between the even and the odd bitlines. Therefore, the bias voltage VDD-VTH is increased by a voltage equal to about 80% of the supply voltage, that is, the even bitlines are biased with a voltage Vboost: Vboost=VDD−VTH+0.8*VDD.

Also, the even bitlines that include cells to be programmed (that should remain grounded) will be biased with a certain voltage, but they will discharge immediately through the transistor SELBLE.

If, for example, the supply voltage VDD is 2.5V and VTH is 1V, the boosted voltage Vboost is 3.5V. If the supply voltage VDD was 3.8V, the boosted voltage Vboost would be 5.8V. The above examples demonstrate that it is possible to increase the bias voltage of bitlines not to be programmed with a boosted voltage sufficient to prevent undesired programming operations. Therefore, it is not necessary to use dedicated charge pump generators or increase the programming times.

It is possible to obtain an even larger boosted voltage if the memory already includes a charge pump that generates the voltage Vsurv by biasing the node VIRPWR with the voltage Vsurv instead of the supply voltage VDD, thus obtaining Vboost=VDD−VTH+0.8*Vsurv. Once the cells that are not to be programmed are at a boost bias voltage, program pulses WL are provided to the cells of a selected wordline.

As a less preferred alternative, the even bitlines that include cells not to be programmed may be biased with a voltage smaller than the supply voltage VDD and the adjacent odd bitlines also with a voltage smaller than the supply voltage, provided that the bias voltage of the even bitlines is boosted above the supply voltage for inhibiting them from being programmed.

Figure 10:
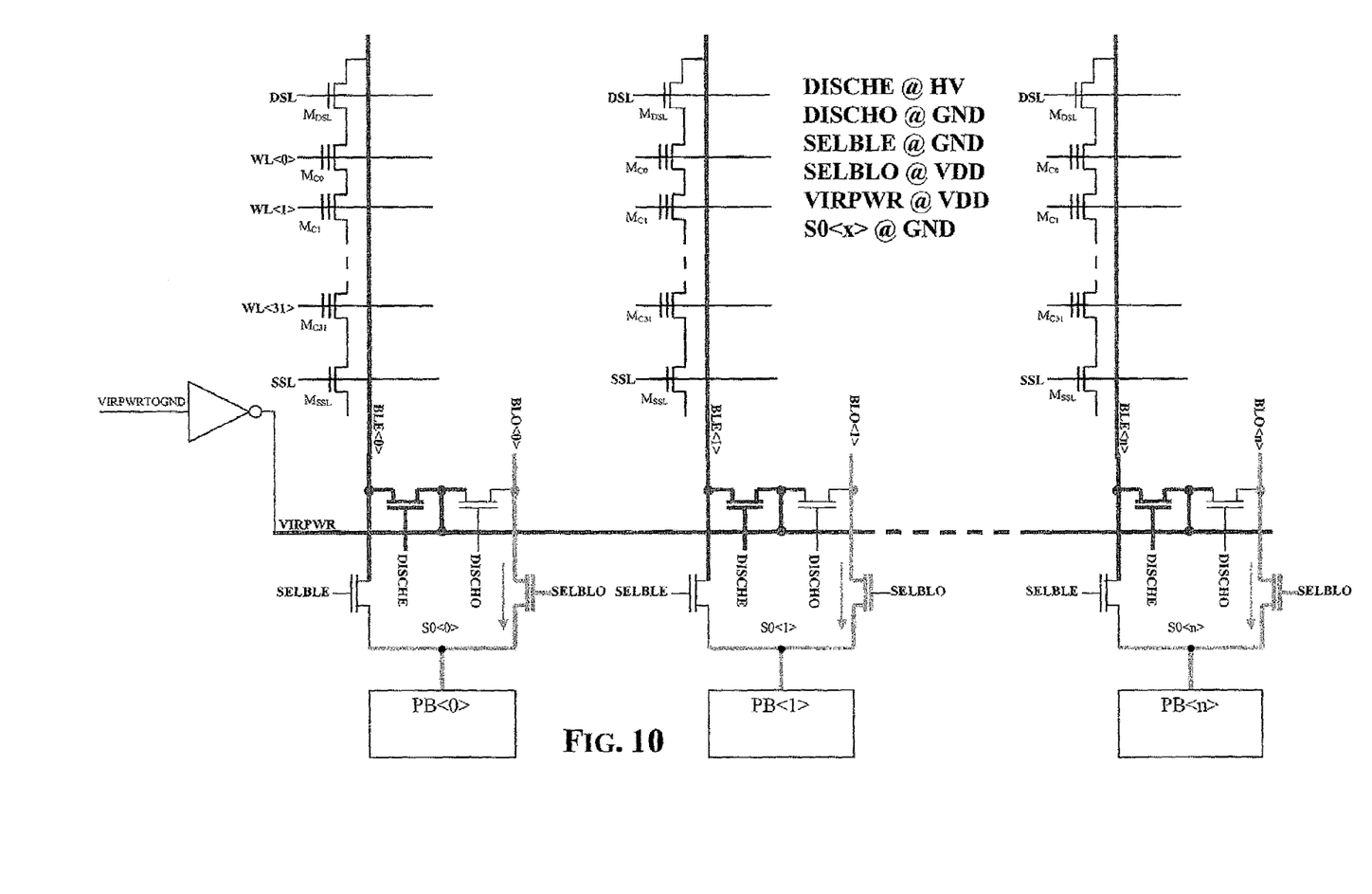

According to a second embodiment, it is possible to increase the boosted voltage Vboost by VTH. The even bitlines are biased with the voltage VDD through the signals DISCHE when the line VIRPWR is at the supply voltage VDD (FIG. 10). The odd bitlines are grounded by turning on the respective selection switches through the signals SELBLO (DISCHO is off) and making the page buffer keep at a ground potential the respective output node SO. Therefore, the odd bitlines are grounded while the even bitlines are biased with the voltage VDD and not with the voltage VDD-VTH, because the even bitlines are biased by the line VIRPWR and not by the page buffer.

Figure 11:
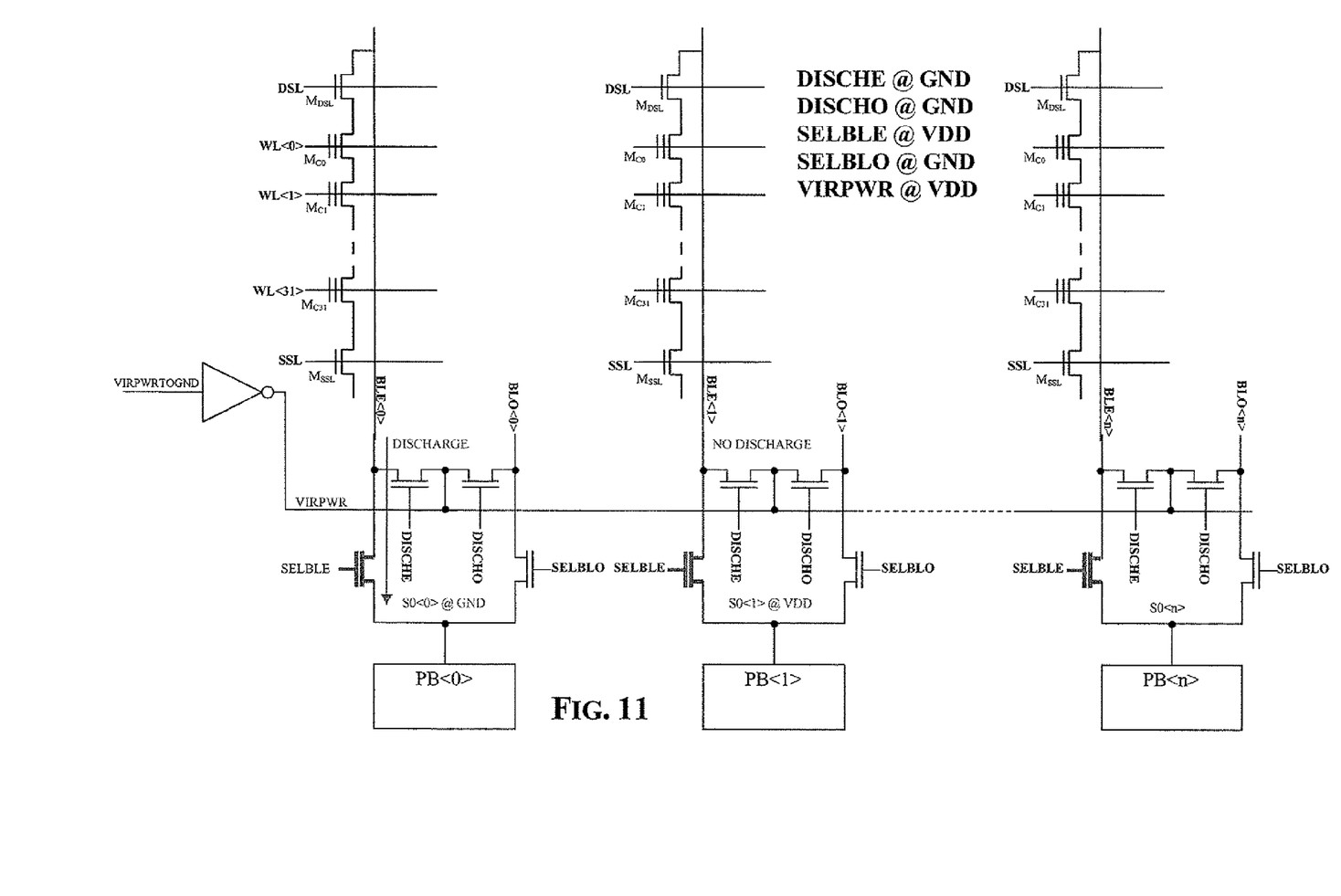
FIGS. 11 and 12 illustrate various steps of a second embodiment of the method according to the present invention.

All the switches SELBLx are switched on and the page buffer biases all the bitlines with the voltage VDD if they are not to be programmed or with the ground potential in the opposite case. By opening the selector switches SELBLE the even bitlines are discharged (FIG. 11) depending on whether or not they include cells to be programmed.

Figure 12:
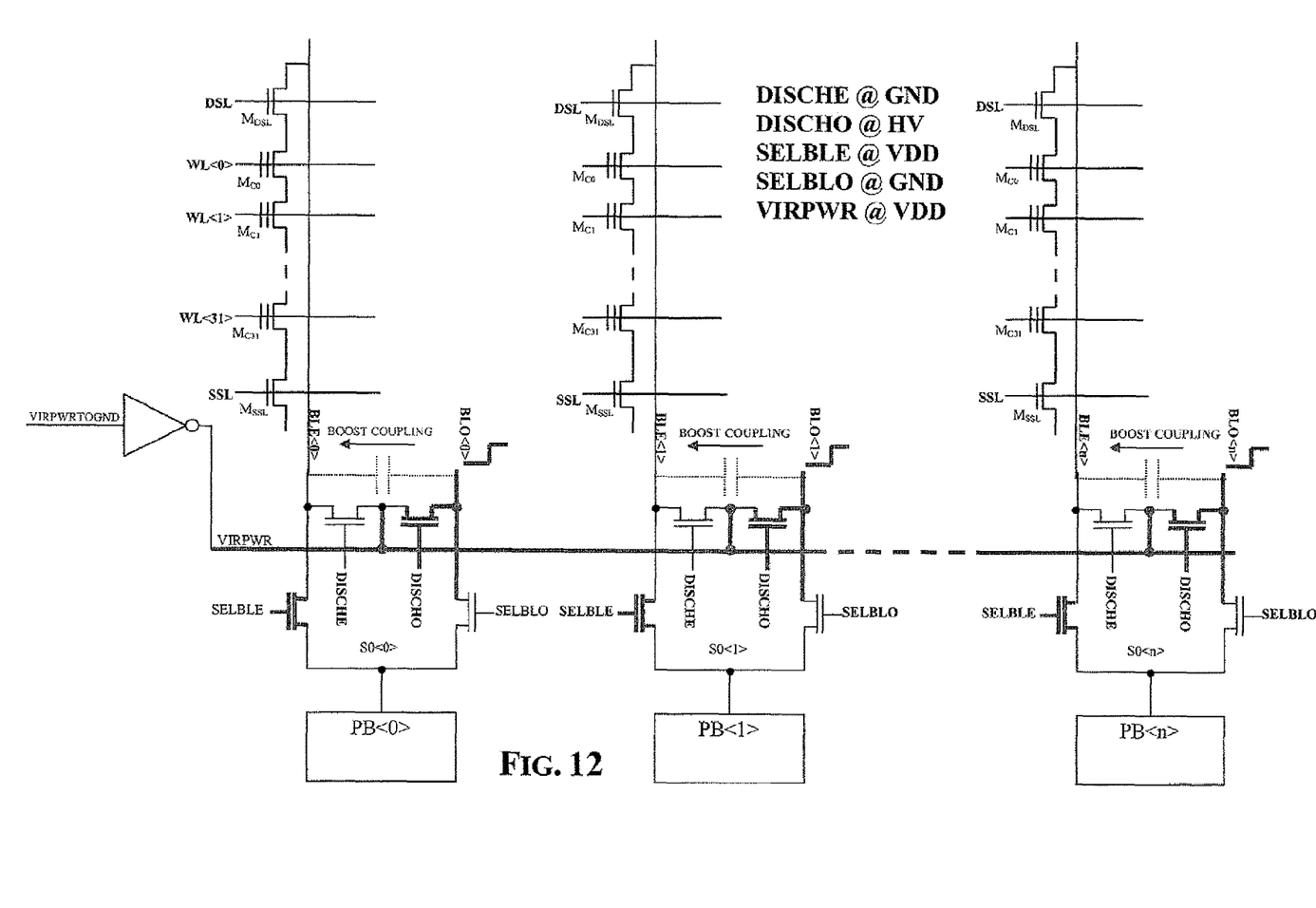

At this point, only the bitlines to be programmed are grounded. Thus (FIG. 12) the bias voltage of the even bitlines is boosted by switching on the switch DISCHO (the node VIRPWR is already at the supply voltage VDD). The boosted voltage is: Vboost=VDD+0.8*VDD.

Figure 13:
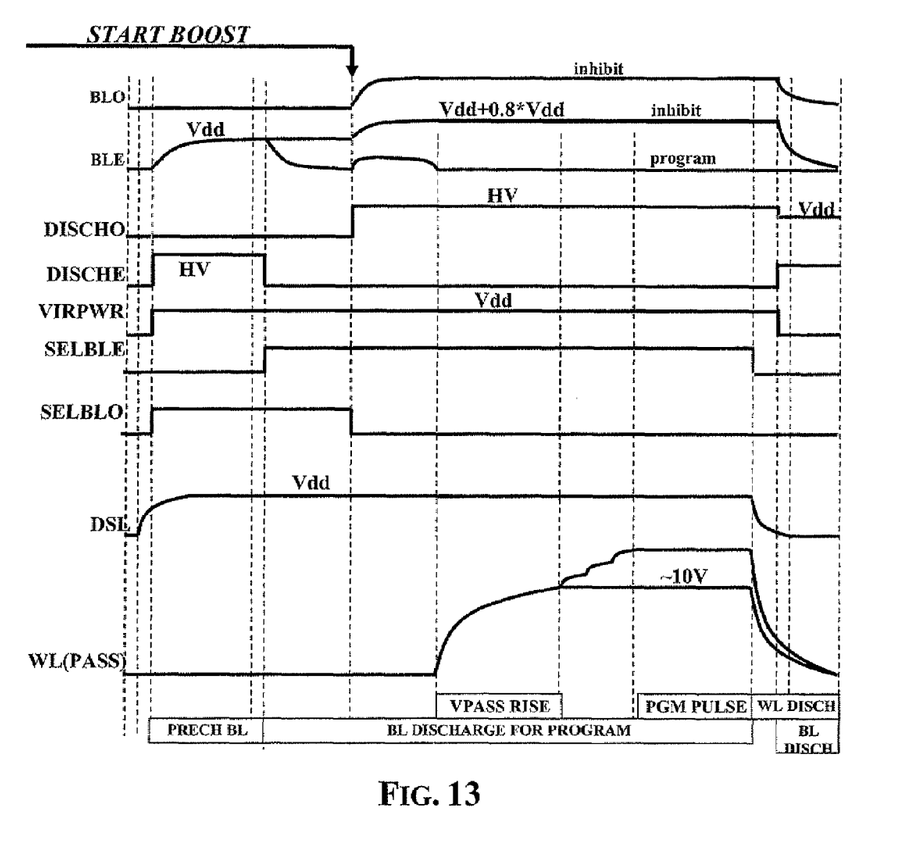
FIG. 13 is a timing graph of the main signals of the memory device during a program operation according to a second embodiment of the present invention.

The boosted voltage is larger than the previous case because the bitlines not to be programmed are biased through the selector DISCHE and not by the page buffer through the signal SELBLE. Finally, program pulses WL are distributed to the cells of a selected wordline. A sample timing diagram of the main signals while executing the method steps of this other embodiment is depicted in FIG. 13. This is self-explanatory for those skilled in the art and will not be illustrated further.

As in the previous embodiment, if a charge pump voltage generator is available in the memory device, it is possible to bias the odd bitlines with the voltage Vsurv generated by it, thus Vboost=VDD+0.8*Vsurv. The larger the scaling down of the size of memory devices, the more relevant the coupling capacitances between adjacent bitlines, and thus the illustrated method is more effective.

That which is claimed:

1. A method of programming selected memory cells of a NAND memory device while protecting deselected memory cells from being programmed, the NAND memory device comprising an array of memory cells arranged as a plurality of bitlines, the method comprising:
    programming a first set of bitlines that includes every other bitline of the plurality of bitlines by
        biasing first bitlines that include memory cells not to be programmed at a first voltage, each biased first bitline being inhibited from receiving program pulses, the first bitlines being part of the first set of bitlines, wherein said biasing of the first bitlines is done by coupling the first bitlines to respective page buffers;
        biasing each bitline of a second set of bitlines that is adjacent to one of the first bitlines at a second voltage to boost the first voltage above a supply voltage of the NAND memory device, the second set of bitlines including all bitlines of the plurality of bitlines that are not included in the first set of bitlines, wherein biasing each bitlines of the second set of bitlines is done by coupling each of the bitlines of the second set to a line that is independent of a respective page buffer;
        biasing, at a reference potential, second bitlines of the first set of bitlines that include memory cells to be programmed to let the second bitlines receive program pulses; and
    issuing the program pulses to the first set of bitlines; and
    programming the second set of bitlines, after said programming of the first set of bitlines.

2. The method of claim 1, wherein the first set of bitlines are even bitlines, and the second set of bitlines are odd bitlines.

3. The method of claim 1, wherein the second voltage is either the supply voltage of the NAND memory device or an auxiliary voltage.

4. The method of claim 1, wherein the program pulses are issued in parallel.

5. The method of claim 1, wherein the first voltage is the supply voltage of the NAND memory device.

6. The method of claim 3, wherein the second voltage is an auxiliary voltage and the NAND memory device comprises a charge pump voltage generator that supplies a boosted voltage, and wherein the auxiliary voltage is the boosted voltage.

7. The method of claim 1, wherein the NAND memory device comprises a respective selection switch coupled to each bitline, and wherein the memory cells corresponding to the first bitlines that are not to be programmed are biased at the supply voltage of the NAND memory device by turning on the corresponding selection switches that connect the first bitlines to the supply voltage.

8. The method of claim 4, wherein the NAND memory device further comprises a respective page buffer coupled to each bitline, each page buffer comprising an output node in which the supply voltage and the reference potential are alternatively replicated, each first bitline that is not to be programmed is biased at the supply voltage by turning on the corresponding selection switch that connects the first bitline to the output node of the page buffer when at the supply voltage.

9. A memory device comprising:
    an array of memory cells or organized as a plurality of bitlines; and
    a controller configured
    to program a first set of bitlines that includes every other bitline of the plurality of bitlines by being configure to
        bias first bitlines that include memory cells not to be programmed at a first voltage to inhibit reception of program pulses, wherein said biasing of the first bitlines is done by coupling the first bitlines to respective page buffers;
        bias each bitline of a second set of bitlines that is adjacent to one of the first bitlines at a second voltage to boost the first voltage above a supply voltage of the memory device, the second set of bitlines including all bitlines of the plurality of bitlines that are not included in the first set of bitlines, wherein biasing each bitline of the second set of bitlines is done by coupling each of the bitlines of the second set to a line that is independent of a respective page buffer;
        bias at a reference potential, second bitlines of the first set of bitlines that include memory cells to be programmed to let the second bitlines receive program pulses; and
    issue the program pulses to the first set of bitlines; and
    to program the second set of bitlines after said programming of the first set of bitlines.

10. The memory device of claim 9, wherein said first set of bitlines are even bitlines, and said second set of bitlines are odd bitlines.

11. The memory device of claim 9, wherein the second voltage is either the supply voltage or an auxiliary voltage.

12. The memory device of claim 9, wherein the program pulses are issued in parallel.

13. The memory device of claim 9, wherein the first voltage is the supply voltage.

14. The memory device of claim 11, wherein the second voltage is the auxiliary voltage and the memory device further comprises a charge pump voltage generator that supplies a boosted voltage, and wherein the auxiliary voltage is the boosted voltage.

15. The memory device of claim 9, further comprising a respective selection switch coupled to each bitline, and wherein said memory cells corresponding to said first bitlines that are not to be programmed are biased at the supply voltage by turning on said corresponding selection switches that connect the first bitlines to the supply voltage.

16. The memory device of claim 15, further comprising a respective page buffer coupled to each bitline, each page buffer comprising an output node in which the supply voltage and the reference potential are alternatively replicated, said first bitlines that are not to be programmed are biased at the supply voltage by turning on said corresponding selection switch that connects said bitline to the output node of said page buffer when at the supply voltage.

17. The memory device of claim 9, wherein said array of memory cells is configured so that the memory device is a NAND memory device.

* * * * *

UNITED STATES PATENT AND TRADEMARK OFFICE
CERTIFICATE OF CORRECTION

| | | |
|---|---|---|
| PATENT NO. | : 7,719,894 B2 | Page 1 of 1 |
| APPLICATION NO. | : 11/828716 | |
| DATED | : May 18, 2010 | |
| INVENTOR(S) | : Luca Crippa et al. | |

It is certified that error appears in the above-identified patent and that said Letters Patent is hereby corrected as shown below:

In column 5, line 67, "biasing each bitlines" should read --biasing each bitline--

In column 6, line 46, "by being configure" should read --by being configured--

In column 6, line 42, "cells or organized" should read --cells organized--

Signed and Sealed this
Twenty-ninth Day of November, 2011

David J. Kappos
*Director of the United States Patent and Trademark Office*